United States Patent [19]

Metz

[11] Patent Number: 4,481,480

[45] Date of Patent: Nov. 6, 1984

[54] FEEDBACK AMPLIFIER HAVING A VOLTAGE-CONTROLLED COMPENSATION CIRCUIT

[75] Inventor: Arthur J. Metz, Gervais, Oreg.

[73] Assignee: Tektronix, Inc., Beaverton, Oreg.

[21] Appl. No.: 432,493

[22] Filed: Oct. 4, 1982

[51] Int. Cl.³ .............................................. H03F 1/34
[52] U.S. Cl. .................................... 330/294; 330/107; 330/271
[58] Field of Search ............... 330/107, 260, 282, 294, 330/295, 271

[56] References Cited

U.S. PATENT DOCUMENTS 3,946,328  3/1976  Boctor .................................. 330/107
4,339,729  7/1982  Jason et al. ...................... 330/306 X
4,356,451 10/1982  Wilson ................................. 330/107

Primary Examiner—James B. Mullins
Assistant Examiner—Steven J. Mottola
Attorney, Agent, or Firm—George T. Noe

[57] ABSTRACT

A feedback amplifier is provided with a voltage-controlled compensation circuit which varies the effective feedback capacitance by controlling a proportional amount of feedback current returned via the capacitor to the amplifier summing node. The proportionality and current steering of the feedback current is effected by a multiplier circuit, the bias of which is controlled by an adjustable DC voltage. Several feedback amplifier configurations are shown herein, exemplifying the versatility of the compensation circuit of the present invention.

7 Claims, 5 Drawing Figures

FEEDBACK AMPLIFIER HAVING A VOLTAGE-CONTROLLED COMPENSATION CIRCUIT

BACKGROUND OF THE INVENTION

The present invention relates generally to compensated amplifiers, and more particularly to a compensated feedback amplifier having a voltage-controlled compensation circuit.

Shunt and series feedback amplifiers are forms of amplifiers in which a resistive element is connected from output to input to establish a precise gain factor. Such feedback amplifiers are used in a wide variety of applications so as to be pervasive in the electronics industry. It is also typical to provide capacitive compensation to achieve stability and optimum transient response or frequency response. This compensation is typically implemented by placing a variable capacitor in parallel with the feedback resistor to allow optimum compensation to be adjusted. One problem associated with variable capacitors is that they typically introduce significant parasitic capacitances and inductances into the circuit to be compensated, and consequently can be difficult to adjust for optimum transient response. Also, if the circuit involves more than one feedback capacitor, the problem is compounded. Moreover, it has been heretofore impractical to adjust feedback capacitance as a function of temperature or voltage.

SUMMARY OF THE INVENTION

In accordance with the present invention, a compensated feedback amplifier includes a voltage-controlled compensation circuit which varies the effective feedback capacitance to provide precise compensation without the introduction of the parasitic capacitances and inductances associated with variable capacitors.

The compensation circuit includes two capacitors which are effectively connected in parallel to provide a desired nominal value of feedback capacitance from output to input of the feedback amplifier to be compensated. A first capacitor is connected directly from output to input, which input is kept at virtual ground through operational amplifier action in the case of a shunt feedback amplifier. A second capacitor is connected from the output to a different virtual ground, but one from which AC current from the capacitor is furnished in variably proportional amounts to the feedback amplifier virtual ground to complete the feedback loop. The proportionality and current steering of the current from the second capacitor is effected by a multiplier circuit, the bias of which is controlled by an adjustable DC voltage.

This compensation technique permits more than one feedback amplifier circuit or a differential amplifier circuit to be controlled with a single transient-response control voltage, which is particularly attractive for integrated circuit designs which often incorporate more than one amplifier of similar design on a single semiconductor chip. Also, a temperature coefficient easily may be introduced in the controlling voltage to optimize amplifier transient response at various ambient temperatures. A further benefit obtained by using a multiplier in the compensation circuit is that the multiplier is linear and provides linear control, which is not possible using other voltage-controlled capacitance methods, such as varactor networks or voltage-controlled diodes. This makes it possible to vary feedback capacitance linearly as a function of any input voltage. One example is to vary the compensation as a function of output voltage, such as z-axis drive in an oscilloscope.

It is therefore one object of the present invention to provide a novel method and apparatus for compensation of a feedback amplifier.

It is another object of the present invention to provide a voltage-controlled compensation circuit for a feedback amplifier which varies the effective feedback capacitance by routing a variable proportion of capacitor current to the amplifier summing node.

It is a further object of the present invention to provide a compensation circuit for a feedback amplifier which permits linearly varying the effective feedback capacitance without introducing significant problem-causing parasitic capacitances and inductances.

It is yet another object of the present invention to provide a compensation circuit capable of adjustably compensating one or more amplifiers of similar design by means of a single control voltage.

It is an additional object of the present invention to provide a compensation circuit capable of adjustably compensating differential feedback amplifiers.

Other objects, features, and advantages of the present invention will become apparent to those having ordinary skill in the art upon a reading of the following description when taken in conjunction with the accompanying drawings.

DETAILED DESCRIPTION OF THE DRAWINGS

Figure 1:
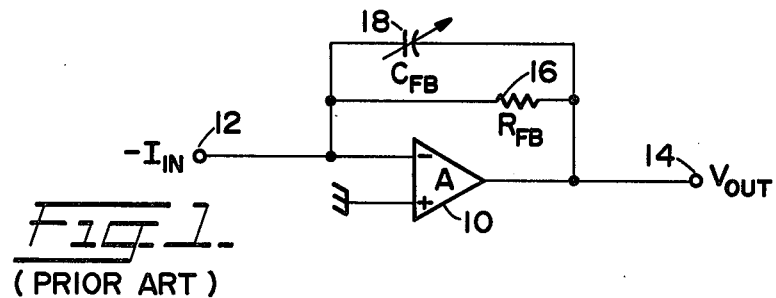
FIG. 1 illustrates a conventional capacitive-compensated shunt feedback amplifier.

Referring now to FIG. 1, there is shown a conventional compensated shunt feedback amplifier comprising an operational amplifier 10 with the inverting input thereof connected to an input terminal 12 and the non-inverting input thereof grounded, and the output connected to an output terminal 14. A gain-setting feedback resistor 16 is connected from the amplifier 10 output to the inverting input thereof, and a compensating capacitor 18 is connected in parallel with resistor 16. The input signal is in the form of a current input $-I_{IN}$ which is forced through resistor 16 to develop a voltage signal $V_{OUT}$ at output terminal 14. The typical method of achieving proper compensation is to apply a step function current to input terminal 12 and adjust capacitor 18 for a square corner on the leading edge of the output voltage step. With the non-inverting input connected to ground, the inverting input of amplifier 10 is held at virtual ground through operational amplifier action—that is, providing sufficient current through the feedback resistor (and capacitor under dynamic or AC conditions) to keep the inverting and non-inverting inputs balanced at the same potential.

Figure 2:
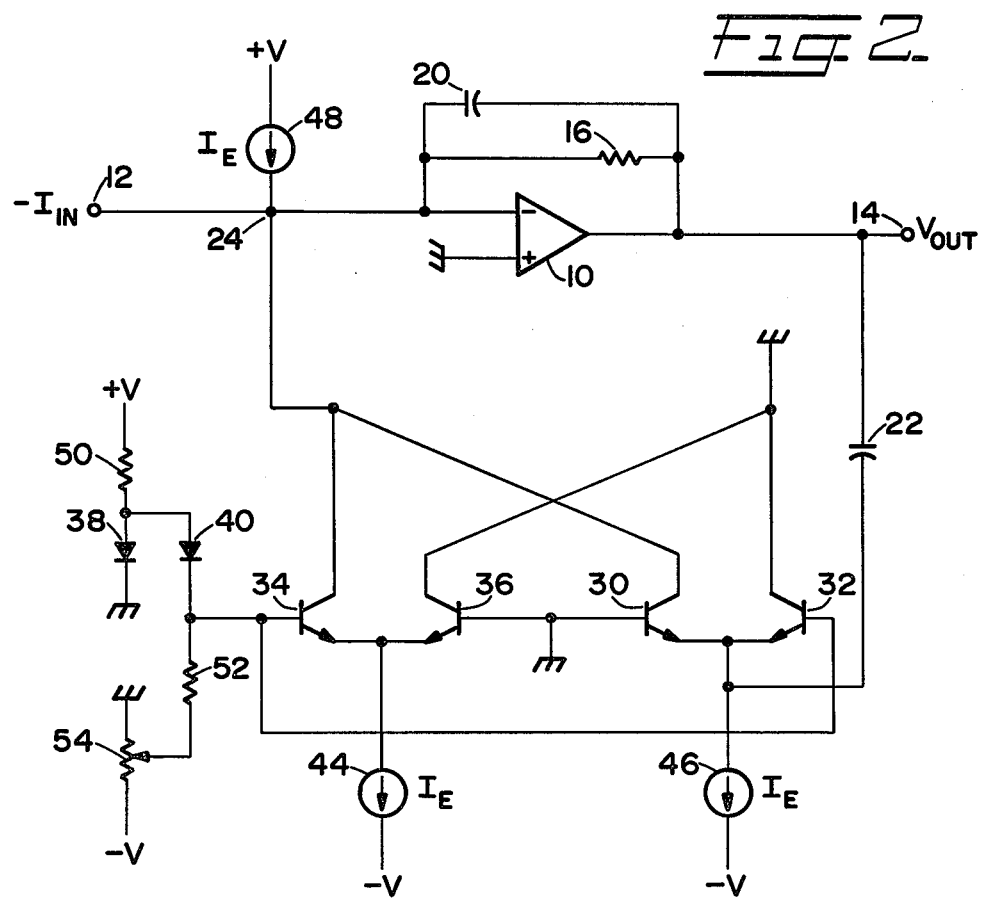
FIG. 2 shows a voltage-controlled compensation circuit for a shunt feedback amplifier in accordance with the present invention.

FIG. 2 shows a compensated shunt feedback amplifier having a voltage-controlled compensation circuit in accordance with the present invention. Here, the shunt feedback amplifier including operational amplifier 10 is shown as described above in connection with FIG. 1; however in place of capacitor 18 is a first feedback capacitor 20 having a value $C_{FB1}$ and a second capacitor 22 having a value $C_{FB2}$ such that $$C_{FB1} + \frac{C_{FB2}}{2} = C_{FB},$$

the desired value for the particular amplifier design. However, the effective capacitance is provided by controlling the amount of current from capacitor 22 to the amplifier summing node 24 as will be described. Capacitor 20 is connected from the output of amplifier 10 to the summing node 24 at the inverting input thereof. Capacitor 22 is connected from the output of amplifier 10 to the emitters of an emitter-coupled pair of transistors 30 and 32, which together with another emitter-coupled pair of transistors 34 and 36 and diodes 38 and 40 forms a multiplier circuit of the type taught by Gilbert in U.S. Pat. No. 3,689,752. The collectors of transistors 30 and 34 are connected together to the summing node 24. The collectors of transistors 32 and 36 are connected together to ground. Connected to the respective common emitters of transistors 30-32 and 34-36 is a constant current sink 44 and 46. A constant current source 48 is connected to the summing node 24 to furnish current to the collectors of transistors 30 and 34. Current sinks 44 and 46 and current source 48 are all constant current generators of equal value $I_E$, which amplies that a standing current of $I_E$ is also pulled from ground by the collectors of transistors 32 and 36.

The bases of transistors 30 and 36 are connected together to ground. The bases of transistors 32 and 34 are connected together to a biasing network including diodes 38 and 40, a resistor 50 connected from the common anodes of diodes 38 and 40 to a suitable positive voltage source, a resistor 52, and a potentiometer 54 connected between ground and a suitable negative voltage source $-V$.

To understand how the DC voltage produced at the wiper arm of potentiometer 54 controls the effective feedback capacitance, consider the following condition: Suppose the wiper arm is at the top, or ground end, of the potentiometer 54. In this condition, transistors 32 and 34 are conducting all of the current $I_E$ in each case while transistors 30 and 36 are off. Therefore, any current produced through capacitor 22 is conducted to ground through transistor 32, and, hence, capacitor 20 represents the entire feedback capacitance because capacitor 22 is effectively out of the circuit. Now consider the situation in which the wiper arm is at the bottom, or $-V$ end of potentiometer 54. Here, transistors 30 and 36 are conducting while transistors 32 and 34 are off, so that any current through capacitor 22 is connected to virtual ground at summing node 24 through transistor 30. At the midpoint of potentiometer 54, then, all four transistors 30-34 conduct equally so that current through capacitor 22 is split equally between transistors 30 and 32. It now becomes apparent that as potentiometer 54 is adjusted throughout its range, current through capacitor 22 is shifted between transistors 30 and 32. In conclusion, it can be discerned that the adjustment of potentiometer 54 controls that proportion of current through capacitor 22 that reaches the summing node 24, thus controlling the effective feedback capacitance. It should be pointed out that the control provided by potentiometer 54 in shifting current between transistors 30 and 32 (where capacitor 22 current is affected) is linear due to the linearizing function of diodes 38 and 40.

Figure 3:
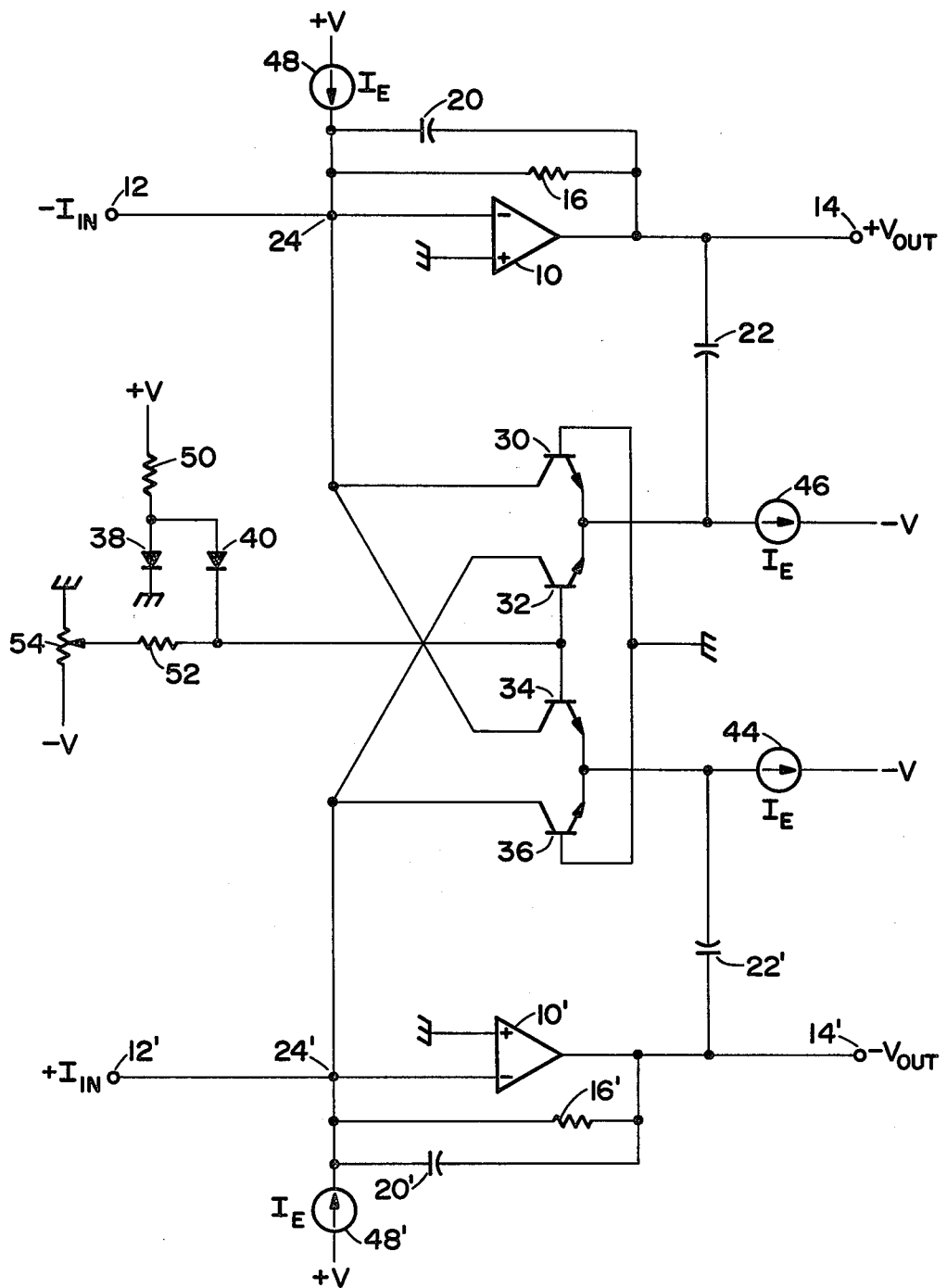
FIG. 3 shows a compensated push-pull amplifier in accordance with the present invention.

A push-pull, or differential amplifier configuration embodying the compensation circuit of the present invention is shown in FIG. 3. Where the appropriate, the reference numerals of FIG. 2 have been retained, with prime symbols added to corresponding components on the other side of the push-pull amplifier. An input differential current signal is applied to input terminals 12—12' and an output differential voltage signal is taken across terminals 14—14'. Rather than the collectors of transistors 32 and 36 being connected to ground as for the single-ended configuration of FIG. 2, they are connected to provide positive feedback to summing node 24' of amplifier 10'. A capacitor 22' is connected from the common emitters of transistors 34 and 36 to the output of amplifier 10'. A current source 48' is provided to supply the current demanded by the collectors of transistors 32 and 36. In all other respects, amplifier 10' and feedback components 16' and 20' are substantially identical to amplifier 10, resistor 16, and capacitor 20, respectively. At the midrange setting of the compensation circuit, the positive feedback from capacitor 22 nulls the negative feedback from capacitor 22'. Thus, the adjustment range of effective feedback capacitance is $C_{FB1} - C_{FB2}$ to $C_{FB1} + C_{FB2}$. It can be seen that adjustment of potentiometer 54 adjusts the compensation and transient response equally for both sides of the push-pull amplifier, which makes it particularly attractive to implement this amplifier configuration in integrated circuit form.

Figure 4:
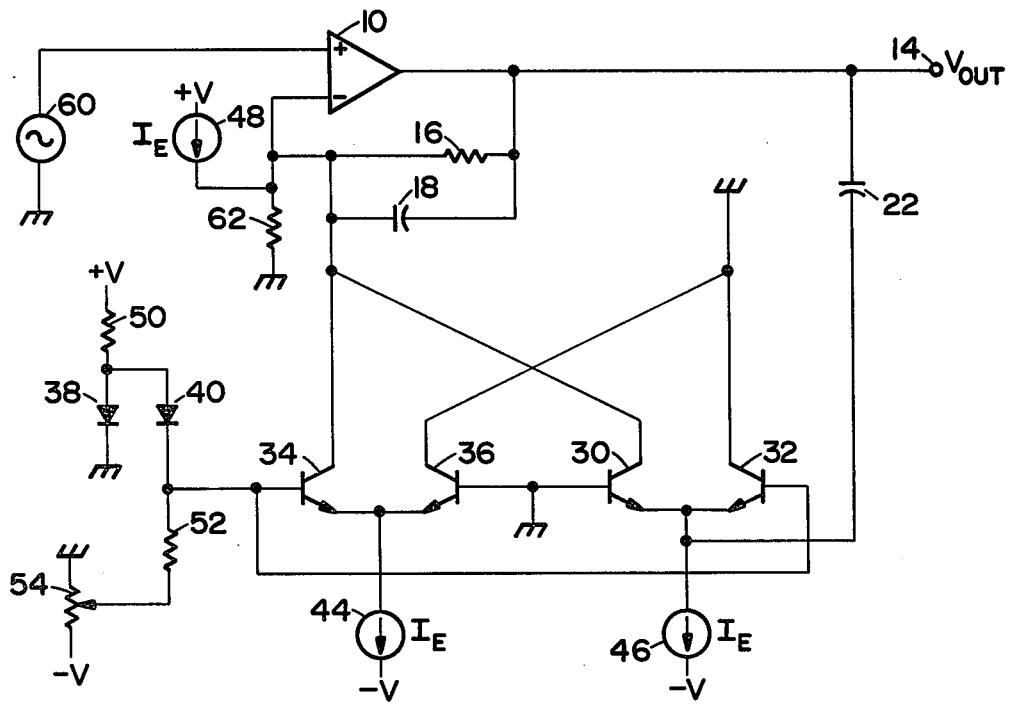
FIG. 4 shows a voltage-controlled compensation circuit for a series feedback amplifier in accordance with the present invention.

FIG. 4 shows a series feedback amplifier incorporating a voltage-controlled compensation circuit in accordance with the present invention. This configuration may be compared with the shunt feedback amplifier configuration of FIG. 2, and only the differences will be described. Like reference numerals are used for like components. A voltage generator 60 to represent a signal source is coupled to the non-inverting terminal of amplifier 10. A resistor 62 is connected from the inverting terminal of amplifier to ground. In operation, the inverting and non-inverting terminals of amplifier 10 attempt to remain balanced, so the input signal is developed across resistor 62 and the current therethrough flows through resistor 16 to develop the output voltage. Thus, the output voltage is the same polarity as the input voltage, and the amplifier gain is determined by the ratio of the resistors 16 and 62. The compensation mechanism works in substantially the same way as for FIG. 2, although it must be pointed out that the junction of resistors 16 and 62 is not a virtual ground.

Figure 5:
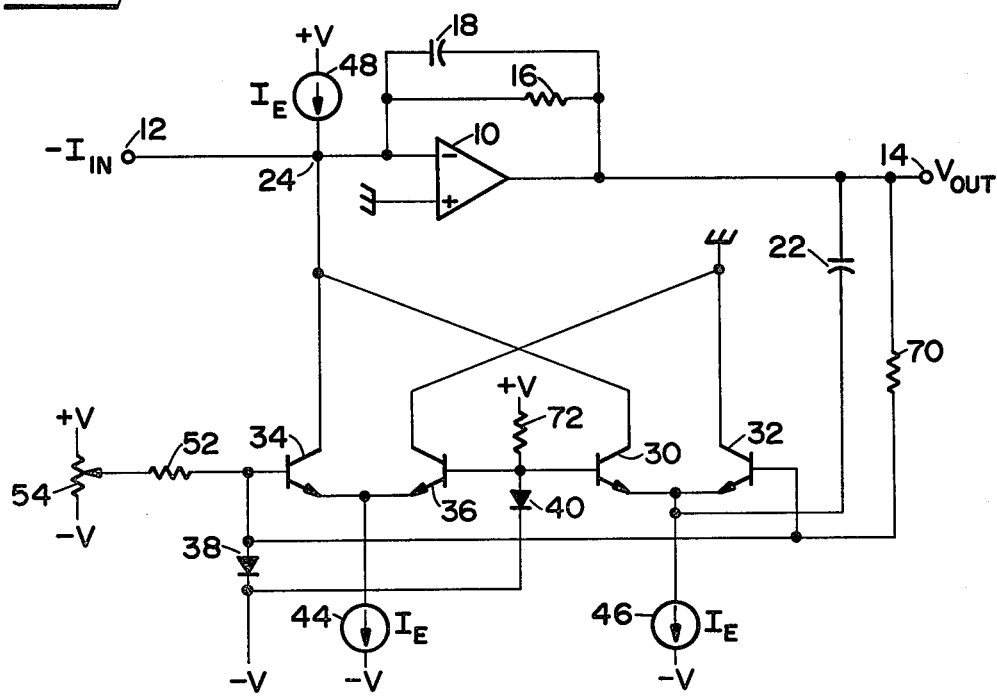
FIG. 5 shows a shunt feedback amplifier in which compensation is a function of output voltage.

FIG. 5 shows a shunt feedback amplifier again; however, in this configuration the compensation is a function of output voltage. Here, the output voltage is coupled via a resistor 70 to the bases of transistors 32 and 34 to control the balance of current through the respective emitter-coupled pairs. Transient-response current is injected via capacitor 22 into the emitters of transistors 30 and 32 as before. Diodes 38 and 40 are connected slightly differently in this configuration to permit the output voltage to be applied to the bases of transistors 32 and 34 as well as to provide the linearizing function. Resistor 72 is added as a bias resistor. This amplifier configuration is ideally suited for voltage level-setting applications, such as, for example, z-axis or intensity drive for cathode-ray tubes. In this type of amplifier configuration, response is significantly slowed on larger amplitude output steps. It can be discerned, then, that a peaking effect will be exhibited by delivering a greater amount of AC current from capacitor 22 to ground, improving transient response of large positive-going voltage steps. Of course, for smaller steps, more of the AC current is delivered to summing node 24 via transistor 30.

While I have shown and described the preferred embodiments of my invention, it will be apparent to those skilled in the art that many changes and modifications may be made without departing from my invention in its broader aspects.

What I claim as being novel is:

1. A compensation circuit for a feedback amplifier having a feedback resistor connected from the output thereof to an input thereof, comprising:
   feedback capacitance means coupled from said output to said input in parallel with said feedback resistor; and
   means for varying the effective capacitance of said feedback capacitance means by varying the feedback current from said capacitance means to said input in amounts proportional to said effective capacitance without changing the actual capacitance.

2. A compensation circuit in accordance with claim 1 wherein said feedback capacitance means comprises a first feedback capacitor connected directly across said feedback resistor, and a second feedback capacitor connected from said output to said current varying means.

3. A compensation circuit in accordance with claim 2 wherein said current varying means comprises a multiplier in which current is shifted in response to a variable control voltage.

4. A compensation circuit in accordance with claim 3 wherein said multiplier is a linear multiplier comprising at least a pair of emitter-coupled transistors, wherein said second feedback capacitor is coupled to said emitters and wherein the collector of one of said transistors is coupled to said input.

5. A compensation circuit in accordance with claim 4 wherein said variable control voltage is provided by a potentiometer.

6. A compensation circuit in accordance with claim 4 wherein said variable control voltage is provided by coupling said output to said multiplier in such a manner that as output voltage level is changed, appropriate current shifting is provided to effect transient response compensation.

7. A compensation circuit in accordance with claim 1 further including at least one additional feedback amplifier having a feedback resistor connected from the output thereof to an input thereof, wherein said feedback capacitance means is coupled from both said outputs to both said inputs, and wherein said current varying means varies the current to both said inputs in response to a single control voltage.

* * * * *